(12) United States Patent
Mason et al.

(10) Patent No.: US 7,342,950 B1
(45) Date of Patent: Mar. 11, 2008

(54) TUNABLE LASER SOURCE WITH INTEGRATED OPTICAL MODULATOR

(75) Inventors: Thomas Gordon Beck Mason, Bethlehem, PA (US); Larry A. Coldren, Santa Barbara, CA (US); Gregory Fish, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 115 days.

(21) Appl. No.: 10/049,362

(22) PCT Filed: Aug. 29, 2000

(86) PCT No.: PCT/US00/23710

§ 371 (c)(1),
(2), (4) Date: Feb. 6, 2002

(87) PCT Pub. No.: WO01/18919

PCT Pub. Date: Mar. 15, 2001

Related U.S. Application Data (60) Provisional application No. 60/152,432, filed on Sep. 3, 1999.

(51) Int. Cl.
*H01S 5/00* (2006.01)
(52) U.S. Cl. .................... 372/50.1; 372/43.01
(58) Field of Classification Search ............ 372/43, 372/45, 50, 46, 20, 99; 437/127
See application file for complete search history.

(56) References Cited

U.S. PATENT DOCUMENTS

| | | | |
|---|---|---|---|
| 4,315,226 A | | 2/1982 | Chinone et al. |
| 4,896,325 A | * | 1/1990 | Coldren .................... 372/20 |
| 4,896,328 A | * | 1/1990 | Sekiguchi et al. ............ 372/45 |
| 5,138,626 A | * | 8/1992 | Yap ..................... 372/46.016 |
| 5,208,821 A | * | 5/1993 | Berger et al. .......... 372/46.012 |
| 5,543,353 A | * | 8/1996 | Suzuki et al. .................. 438/31 |
| 5,883,914 A | * | 3/1999 | Kinoshita ................... 372/50.1 |
| 6,320,688 B1 | * | 11/2001 | Westbrook et al. .......... 398/194 |
| 6,628,690 B1 | * | 9/2003 | Fish et al. ..................... 372/50 |
| 2002/0186736 A1 | * | 12/2002 | Takahashi ..................... 372/50 |

(Continued)

FOREIGN PATENT DOCUMENTS

EP   0 391 334   10/1990

(Continued)

OTHER PUBLICATIONS

Mason et al. (Widely Tunable Sampled Grating DBR Laser with Integrated Electroabsorption Modulator in IEEE Photonics Technology Letters, vol. 11.No. 6, Jun. 1999).*

(Continued)

*Primary Examiner*—Michael Dung Nguyen
(74) *Attorney, Agent, or Firm*—Gates & Cooper LLP (57) ABSTRACT

A tunable laser source (10) with an integrated optical modulator (20). The laser source (10) is a widely tunable semiconductor laser that is comprised of an active region on top of a thick low bandgap, waveguide layer (22), wherein both the waveguide layer (220) and the active region are fabricated between a p-doped region and an n-doped region. An electro-absorption modulator (20) is integrated into the semiconductor laser (10), wherein the electro-absorption modulator (20) shares the waveguide layer (22) with the semiconductor laser.

8 Claims, 7 Drawing Sheets

U.S. PATENT DOCUMENTS

2003/0007719 A1* 1/2003 Forrest et al. ................ 385/14

FOREIGN PATENT DOCUMENTS

| | | |
|---|---|---|
| EP | 0 690 534 | 1/1996 |
| WO | WO 98/10544 | 3/1998 |

OTHER PUBLICATIONS

Raybon et al. (A 2.5-Gbit/s return-to zero integrated DBR laser/modulator transmitter technical paper), IEEE Phtonics Technology Letters, vol. 6, No. 11, Nov. 1994.*

Beck, M. et al., "Widely Tunable Sampled Grating DBR Laser with Integrated Electroabsorption Modulator.", IEEE Photonics Technology Letters, IEEE Inc., New York, vol. 11, No. 6, Jun. 1999, pp. 638-640.

Raybon, G. et al., "Gain-Switching of DBR Laser Monolithically Integrated with Electroabsorption Modulator for RZ Transmission", Electronics Letters, IEE Stevenage, GB, vol. 28, No. 2, Jan. 16, 1992, pp. 188-190.

* cited by examiner

TUNABLE LASER SOURCE WITH INTEGRATED OPTICAL MODULATOR

CROSS-REFERENCE TO RELATED APPLICATION

This application claims priority under 35 U.S.C. § 119(e) of U.S. Provisional Patent Application Ser. No. 60/152,432, filed Sep. 3, 1999, by Thomas G. B. Mason, Larry A. Coldren, and Gregory Fish, entitled "TUNABLE LASER SOURCE WITH INTEGRATED OPTICAL MODULATOR," which application is incorporated by reference herein.

STATEMENT REGARDING FEDERALLY SPONSORED RESEARCH AND DEVELOPMENT

This invention was made with Government support under Grant No. N00014-96-1-6014, awarded by the Office of Naval Research. The Government has certain rights in this invention.

BACKGROUND OF THE INVENTION

1. Field of the Invention

This invention relates in general to semiconductor lasers, and in particular to a tunable laser source with integrated optical modulator.

2. Description of the Related Art

Modern day usage of optical components and lasers has made communications and data transfer more efficient and more cost effective. The use of semiconductor lasers has made the fabrication and packaging of optical sources more cost effective, as well as reducing the size of the overall device.

However, the requirements for communications and data transfer systems have also increased. Widely tunable lasers are essential components for a wide variety of wavelength-division multiplexing (WDM) and packet switching network architectures. They can be used as replacement sources in long haul dense WDM communication systems or for wavelength routing in access networks. They are also important devices for next generation phased array radar systems that use true-time delay beam steering.

In order to achieve a wide tuning range, these devices require fairly large passive tuning elements. This makes the devices four to five times larger than conventional fixed wavelength lasers. However, having this large amount of passive material in a laser cavity reduces the speed with which they can be turned on and off by direct current modulation. Moreover, the rate at which they are able to transmit data is limited, making them unsuitable for high bandwidth applications.

There are two other factors that make it difficult to use these devices to transmit data. The wavelength in a sampled grating distributed Bragg reflector (SGDBR) laser is controlled by aligning a pair of reflection peaks in two mirrors with an optical cavity mode. When a gain current is modulated over a wide range of currents, it can disturb this alignment, resulting in mode instability within the device, which is highly undesirable for data transmission. To prevent this mode instability, such devices can only be modulated over a narrow range of output powers, which introduces a significant extinction ratio penalty to their data transmission performance.

The other problem with directly modulating a laser is frequency chirp, which is the shift in the laser oscillation frequency that occurs when the output power level is changed. This is undesirable in transmission systems, since frequency chirp causes pulse spreading, which limits the maximum distance over which data can be sent over an optical fiber or other dispersive medium.

The three most successful types of widely tunable lasers are the super structure grating distributed Bragg reflector laser (SSGDBR), the grating assisted codirectional coupler with sampled grating reflector laser (GCSR), and the sampled grating DBR laser (SGDBR). All of these devices are capable of continuous tuning ranges greater than 40 nm. However, SGDBR lasers and other widely tunable designs have long active sections and fairly large optical cavities that limit their direct modulation bandwidth to between 3 and 4 GHz. This enables them to be used in OC-48 data transmission systems under direct modulation, if some wavelength chirping can be tolerated. However, this bandwidth is insufficient for use in most phased array radar systems or in OC-192 data transmission networks operating at 10 Gb/s.

In these applications, external modulators are frequently used to apply a radio frequency (RF) signal or data to the optical carrier. Even for long-haul OC-48 systems, external modulators are frequently used to minimize frequency chirp. However, external modulators add significant cost and complexity to the optical assembly which can be prohibitive in systems that require a large number of tunable lasers and modulators. For this reason, it is desirable to monolithically integrate a high speed modulator with a tunable laser on as a single semiconductor device.

SUMMARY OF THE INTENTION

To minimize the limitations in the prior art described above, and to minimize other limitations that will become apparent upon reading and understanding the present specification, the present invention discloses a device, method, and article of manufacture related to a tunable laser source with integrated optical modulator. The tunable laser source is a widely tunable semiconductor laser that is comprised of an active region on top of a thick, low bandgap, waveguide layer, wherein both the waveguide layer and the active region are fabricated between a p-doped region and an n-doped region. An electro-absorption modulator is integrated into the semiconductor laser, wherein the electro-absorption modulator shares the waveguide layer with the semiconductor laser.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

The present invention provides a simple and effective method for creating a—tunable laser with an integrated optical modulator that can be fabricated on a single semiconductor chip. The laser can be rapidly tuned over a wide range of wavelengths, thereby enabling it to be used in a variety of applications from wavelength division multiplexed fiber optic communications to phased array radar. Integrating the modulator with the laser provides a highly desirable method for modulating the intensity of the output from the laser without perturbing its mode stability or introducing high levels of frequency chirp. It also enables much higher modulation frequencies to be reached than with the laser alone.

Device Structure

Figure 1:
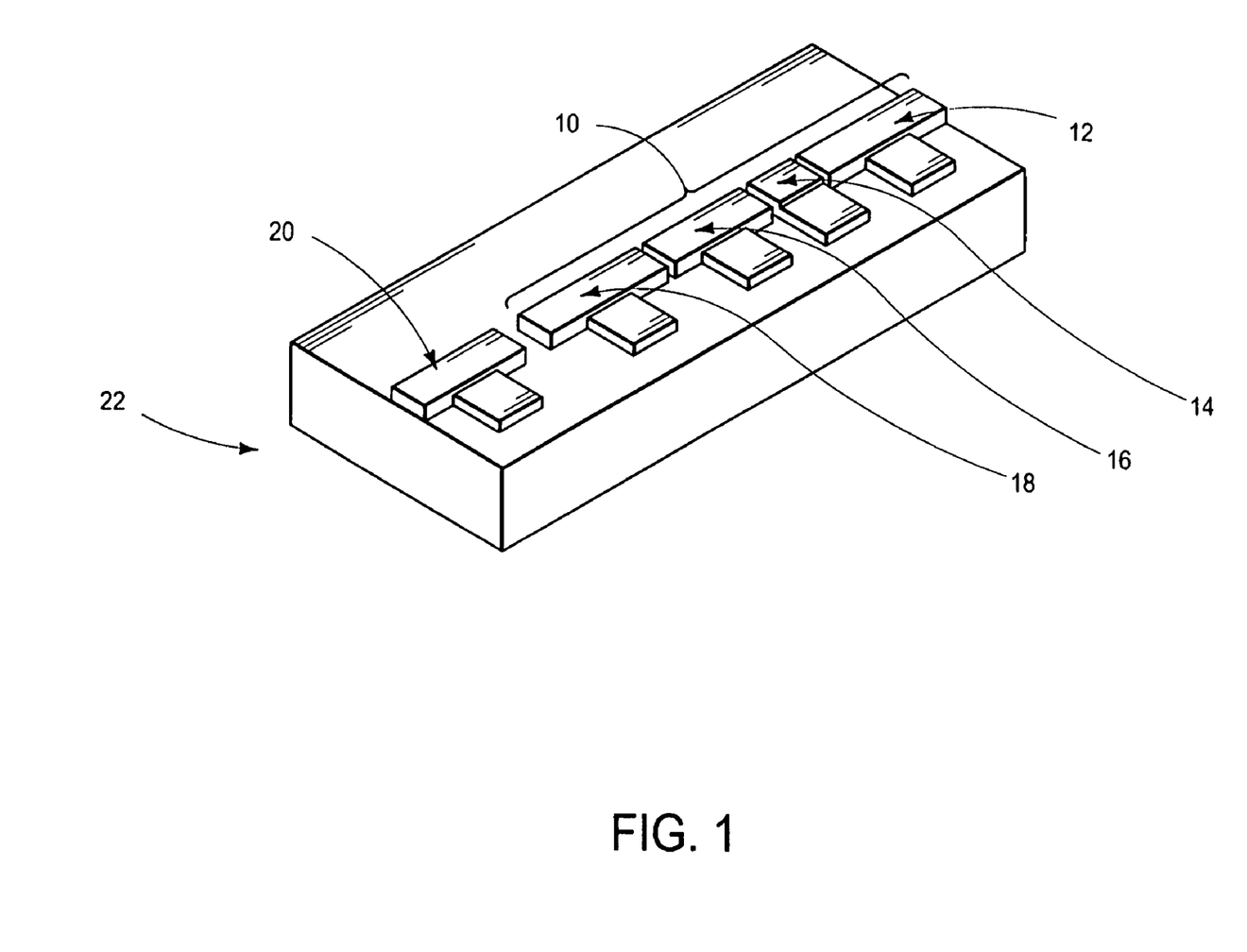
FIG. 1 is a perspective view that illustrates the structure of a widely tunable semiconductor laser with an integrated electro-absorption modulator according to a preferred embodiment of the present invention.

FIG. 1 is a perspective view that illustrates the structure of a widely tunable semiconductor laser with an integrated electro-absorption modulator according to a preferred embodiment of the present invention. The laser 10 is a four-section buried-ridge sampled-grating distributed Bragg reflector (SGDBR) laser. The four separate sections of the laser 10 comprise tuning sections and include: a sampled grating back mirror section 12, a phase control section 14, a gain section 16, and a sampled grating front mirror section 18. An electro-absorption (EA) modulator 20 shares a common waveguide 22 with the back mirror section 12, phase control section 14, gain section 16, and front mirror section 18 of the laser 10, wherein the waveguide 22 is designed to provide high index tuning efficiency in the laser 10 and good reverse bias extinction in the modulator 20. Generally, a bias voltage is connected to the top of the device and a ground is connected to the bottom. When the bias voltage on the gain section 16 is above a lasing threshold, laser 10 output is produced.

Figure 2:
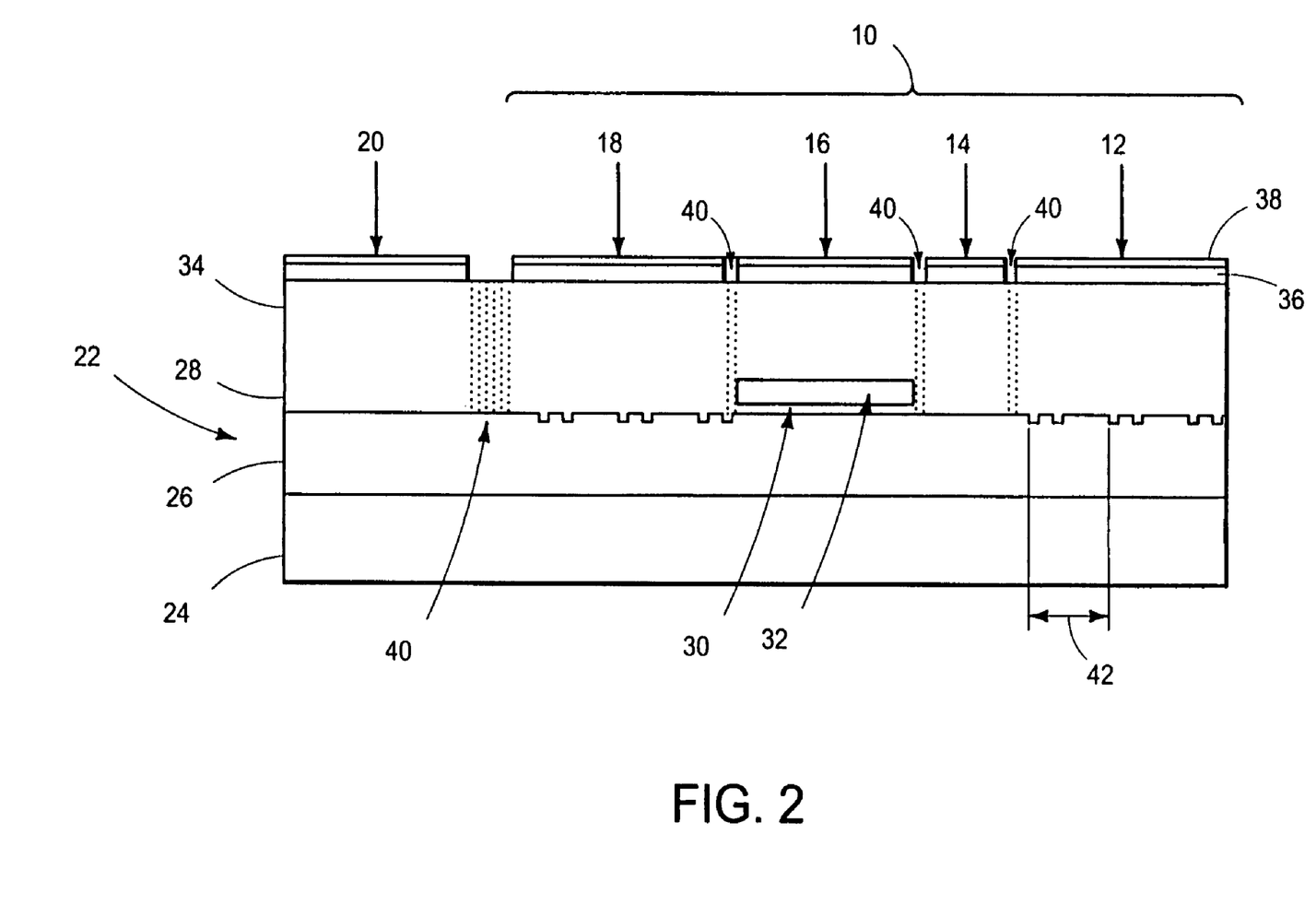
FIG. 2 illustrates a cross-section of the laser and modulator according to the preferred embodiment of the present invention.

FIG. 2 illustrates a cross-section of the integrated laser 10 and modulator 20 device according to the preferred embodiment of the present invention. The device is comprised of an n-doped region 24, a thick, low bandgap waveguide layer 26 (to form the waveguide 22 shown in FIG. 1), an antireflective coating 28, a stop etch layer 30, an active region 32, a p-doped region 34, a p+ contact layer 36, and metal contacts 38.

N-doped region 24 and p-doped region 34 are typically of different dopant types. Although indium phosphide (InP) is used in the preferred embodiment, the doped regions 24 and 34, and active region 32 can be of any laser producing material. Moreover, the relative positions of the n-doped region 24 and p-doped region 34 can be reversed without departing from the scope of the invention.

A lateral waveguide 22 is formed by laterally patterning the waveguide layer 26 or layer 34 above it into a stripe geometry. A key design element of the present invention is that a single common waveguide 22 is used for the tuning sections 12, 14, 16, and 18 in the laser 10, and for the modulator 20. The lateral waveguide 22 structure may be formed as a buried ridge, or other type of lateral waveguide 22 structure, such as a simple ridge.

The p-doped region 34 also includes proton implants 40 above and beside the waveguide 22 that are blocking junctions that act as isolators to block lateral current leakage in the laser 10, as well as to provide isolation between sections in the laser 10, to reduce parasitic junction capacitance of the modulator 20, and to provide isolation from the modulator 20.

The active region 32 includes offset multiple quantum wells (MQW) that provide the laser 10 output. When an electrical current passes from the p-doped region 34 to the n-doped region 24 through the active region 32, a laser 10 light output is produced from the MQW. The active region 32 and the waveguide layer 26 are separated by the stop etch layer 30 to enable the active region 32 to be removed with a selective wet etchant during fabrication.

Both the back and front mirror sections 12 and 18 comprise a set of periodically sampled gratings that are etched into the waveguide layer 26 with a period 42. Gratings of this type act as wavelength selective reflectors, wherein one or more specified sampling periods 42 will provide a partial reflection at periodic wavelength spacings of an optical signal carried by the waveguide 22. The laser 10 can be rapidly tuned over a wide wavelength range by proper adjustment of control currents for the mirror sections 12 and 18, for example, as described in U.S. Pat. No. 4,896,325, which is incorporated by reference herein.

The anti-reflective coating 28 is applied to each end of the device after the device is cleaved out of the wafer.

Tuning Curves

Figure 3A:
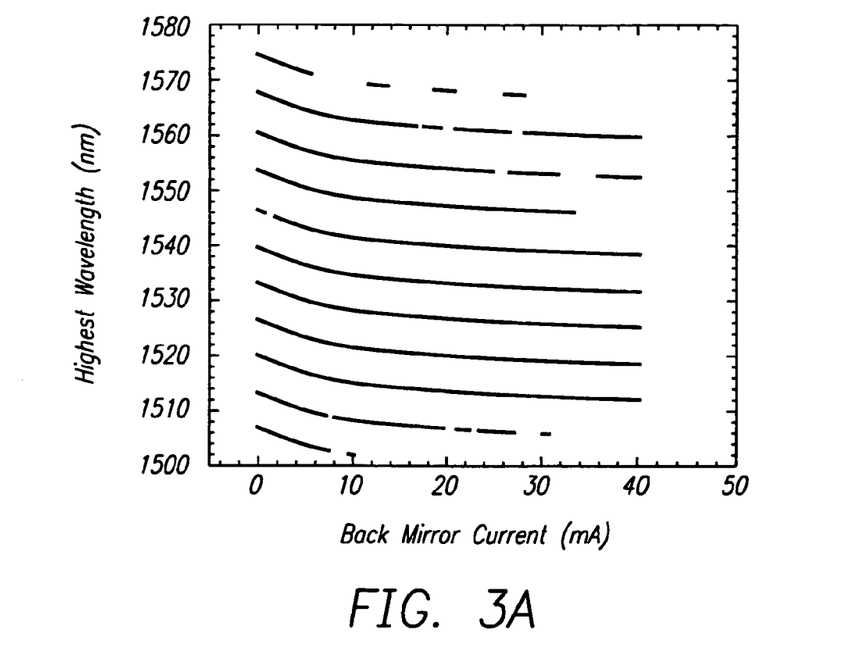
FIGS. 3A and 3B are charts that illustrate the tuning curves for wide wavelength tuning according to the preferred embodiment of the present invention.
Figure 3B:
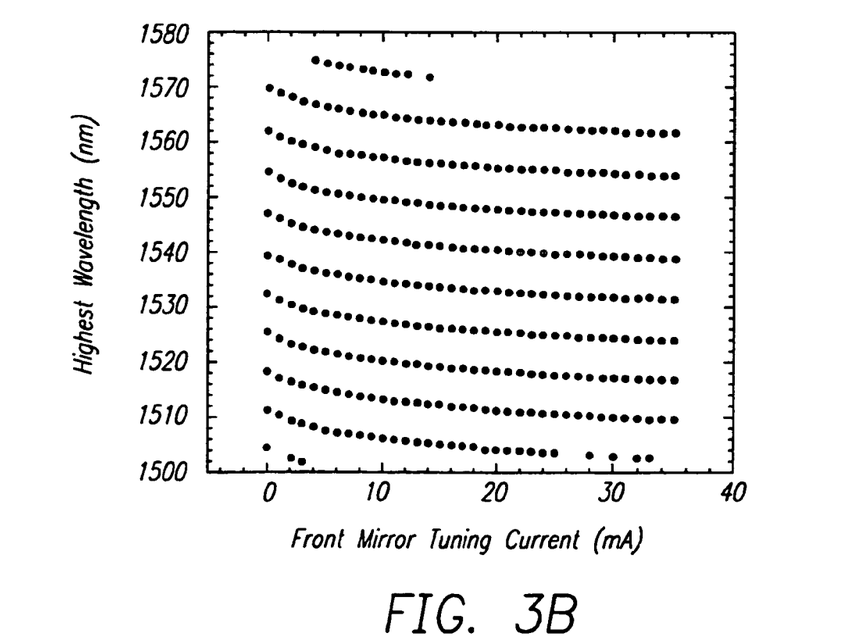

FIGS. 3A and 3B are charts that illustrate the tuning curves for wide wavelength tuning according to the preferred embodiment of the present invention. In FIG. 3A, the X-axis is the back mirror 12 current (mA) and the Y-axis highest wavelength (nm). In FIG. 3B, the X-axis is the front mirror 18 current (mA) and the Y-axis highest wavelength (mm).

As shown in FIGS. 3A and 3B, the principal advantage of this laser 10 is that it can be rapidly tuned over a wide wavelength range by proper adjustment of control currents for the mirrors 12 and 18. This is a highly desirable feature that makes the device of the present invention useful for current and next generation fiber networks.

Franz-Keldysh Effect

Figure 4A:
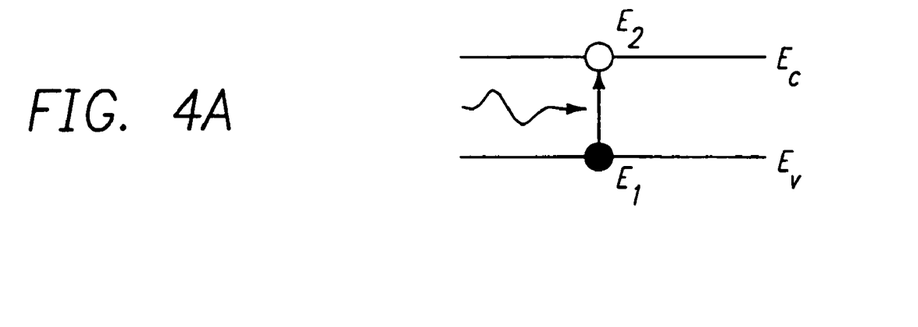
FIGS. 4A, 4B, and 4C illustrate the Franz-Keldysh effect in the modulator according to the preferred embodiment of the present invention.
Figure 4B:
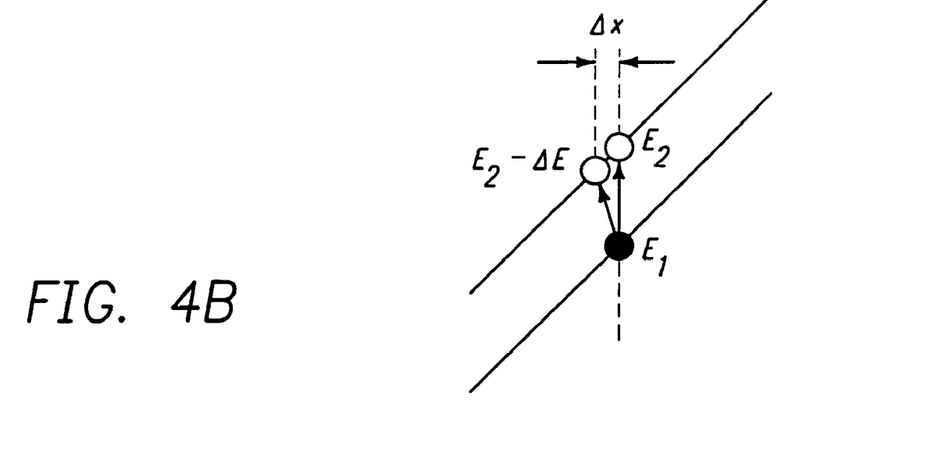
Figure 4C:
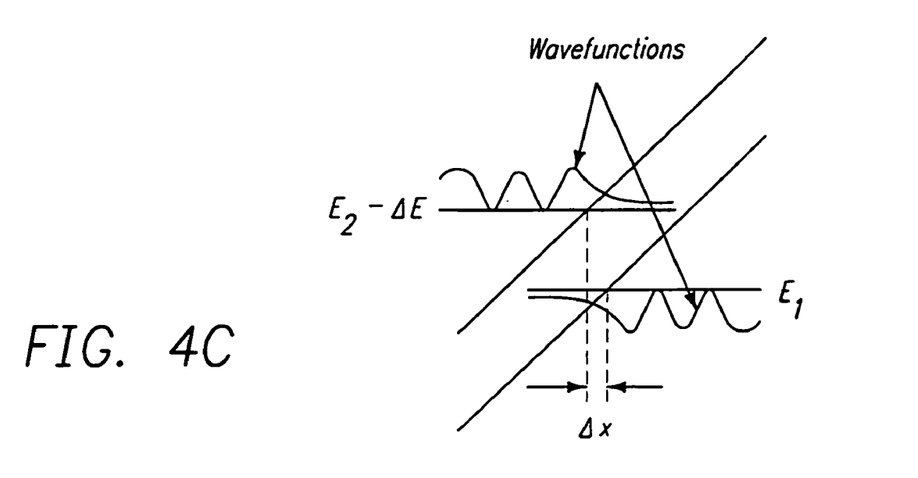

FIGS. 4A, 4B, and 4C illustrate the Franz-Keldysh effect in the modulator 20 according to the preferred embodiment of the present invention. In these diagrams, $E_1$ is the energy level of the valence band ($E_v$), $E_2$ is the energy level of the conduction band ($E_c$), $\Delta E$ is the bandgap between $E_1$ and $E_2$, and $\Delta x$ is the thickness of the waveguide layer 26.

In the present invention, performance is optimized by using a thick, low bandgap waveguide layer 26. This provides good index tuning efficiency in the mirror sections 12 and 18, and a reasonable extinction ratio and chirp parameter in the modulator 20.

The operation of the modulator 20 is based on either the Franz-Keldysh effect in a bulk semiconductor waveguide 22 (which means that the modulator 20 does not include quantum wells) or the quantum confined Stark effect in a MQW. When a strong electric field is applied to the waveguide 22, the band edge of the material is shifted to lower energies allowing it to absorb the output light of the laser 10, as shown in FIGS. 4A, 4B, and 4C. This technique allows very rapid modulation of the laser 10 with minimal wavelength chirping. Under proper conditions, this can produce sufficient optical loss to extinguish the output light intensity by more than 20 dB, even over a wide wavelength range.

For narrower ranges of operation, the modulator 20 could comprise an MQW modulator grown into the center of a higher bandgap waveguide layer 26. This would provide less efficient tuning in the laser 10, but would allow for lower voltage operation in the modulator 20, since the bandgap detuning can be reduced due to the sharper absorption edge of the MQW structure.

Response Curves

Figure 5:
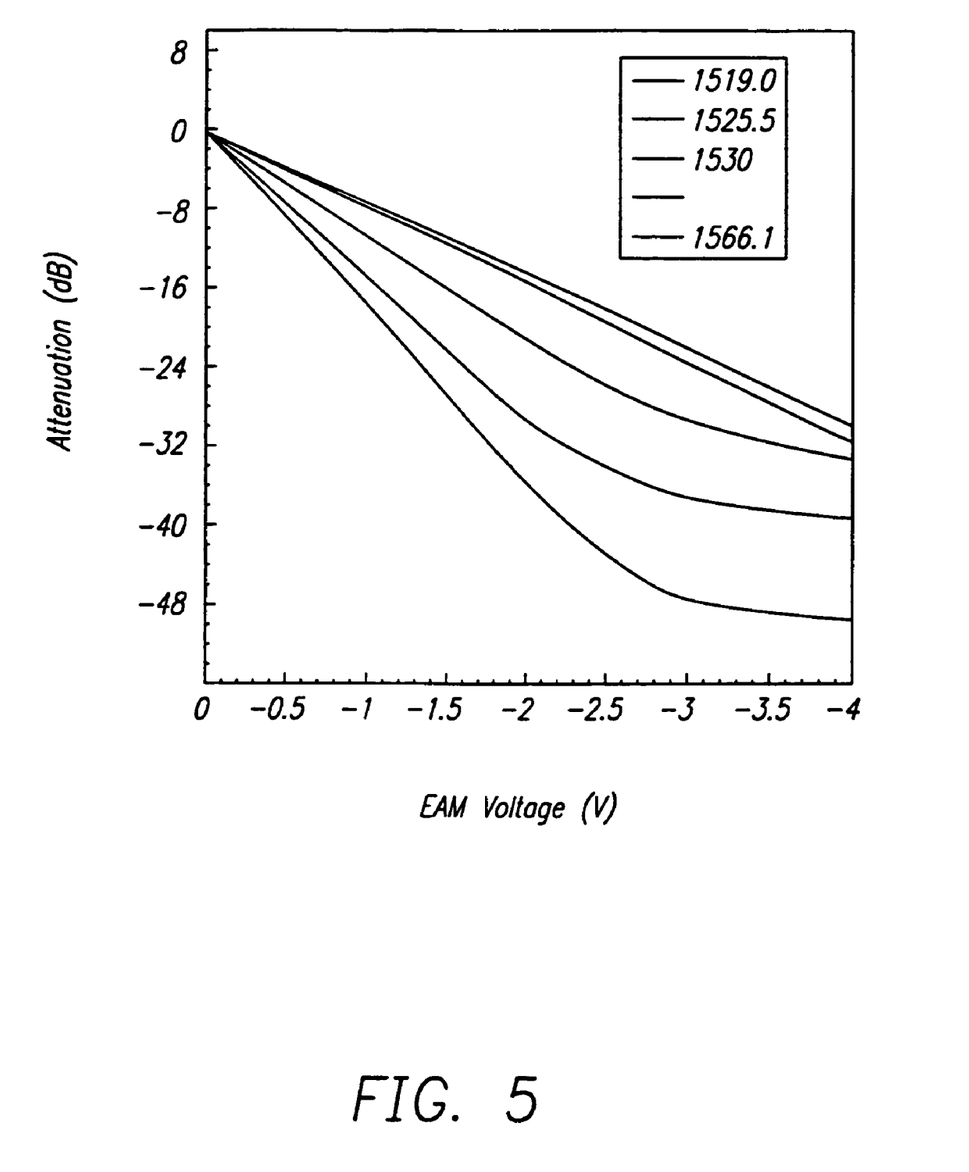
FIG. 5 is a chart that illustrates the response curves for initial tests of the integrated laser and modulator device over a 50 nm tuning range according to the preferred embodiment of the present invention.

FIG. 5 is a chart that illustrates the response curves for initial tests of the integrated laser 10 and modulator 20 device over a 50 nm tuning range according to the preferred embodiment of the present invention. These initial tests of the buried heterostructure electro-absorption modulator 20 integrated with a sampled grating distributed Bragg reflector laser 10 were conducted to demonstrate the operation and benefits of the present invention. In these tests, a 400 nanometer thick waveguide 22 with a bandgap wavelength of 1.4 microns was used. The laser 10 had a tuning range of more than 47 nanometers. The modulator 20 was able to produce more than 26 dB over this entire tuning range with only a 4 volt bias.

Fabrication Process

Figure 6A:
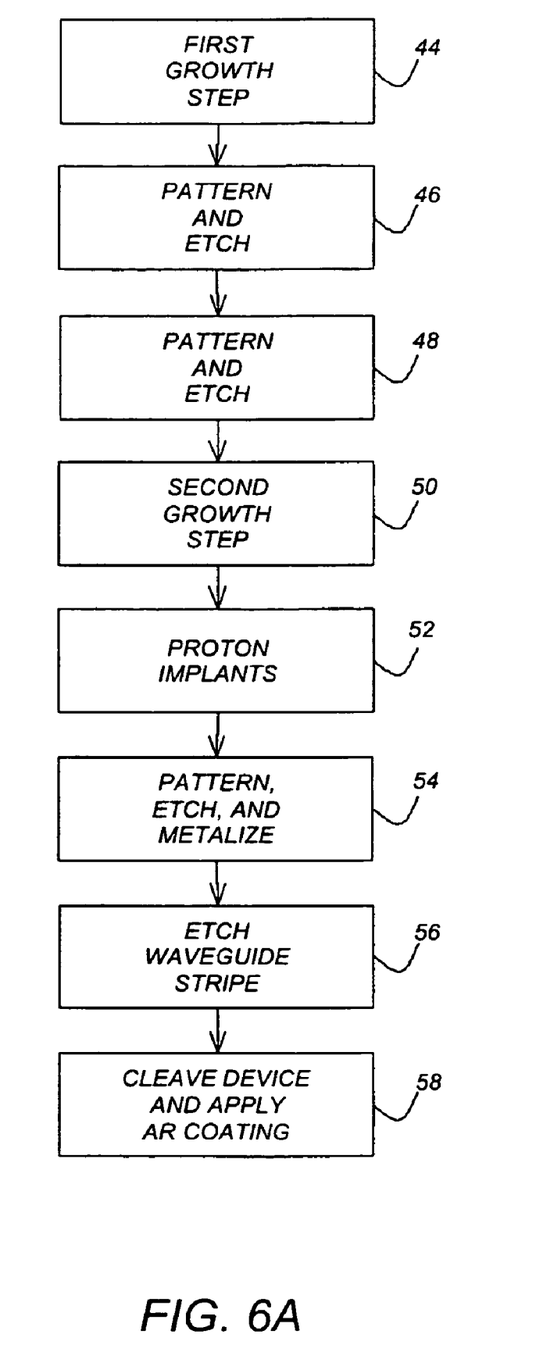
FIGS. 6A and 6B are flowcharts illustrating the steps used in the fabrication process according to the preferred embodiment of the present invention.
Figure 6B:
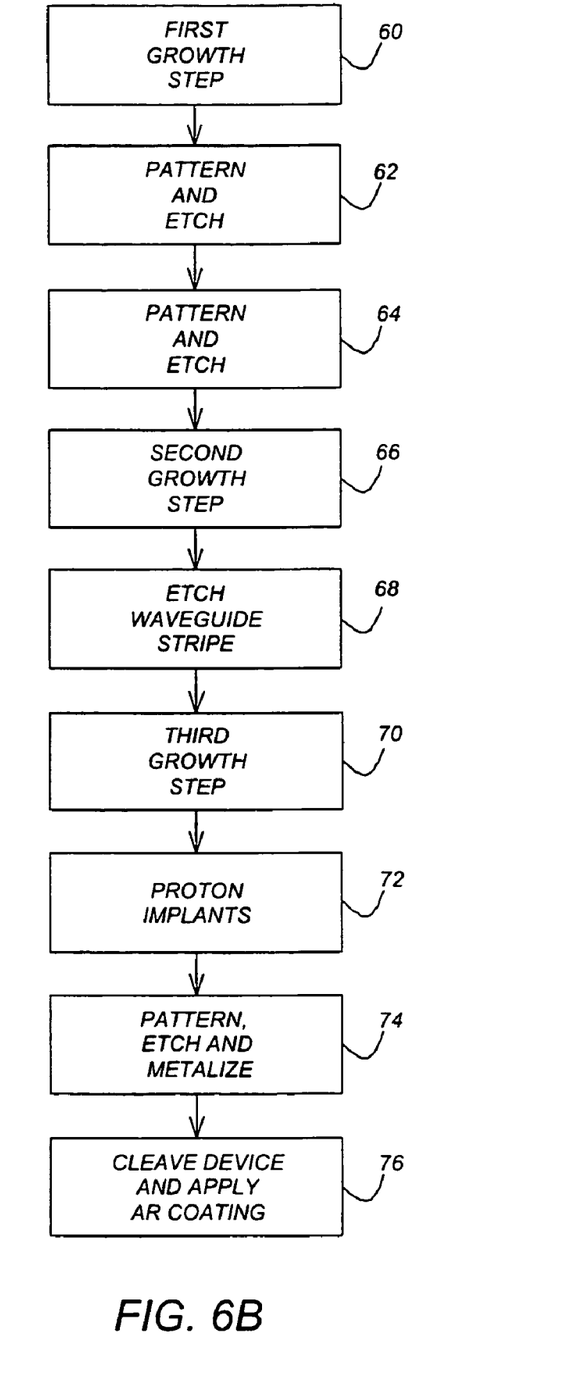

FIGS. 6A and 6B are flowcharts illustrating the steps used in the fabrication process according to the preferred embodiment of the present invention. FIG. 6A shows the steps used when a lateral waveguide is being formed as a simple ridge, while FIG. 6B shows the steps used for other types of lateral waveguiding structures, such as a buried ridge stripe.

Referring to FIG. 6A, Block 44 represents a first growth step, with an n-InP buffer layer 24, Q-waveguide layer 26, stop etch layer 30, active MQW region 32, and small portion of the p-InP cladding layer 34 being grown.

Block 46 represents the patterning and selectively etching off of the thin top p-InP cladding layer 34 and active regions 32 down to the stop-etch layer 30, everywhere except in the gain section 16 of the laser 10.

Block 48 represents the patterning and etching of one or more sets of periodically sampled gratings with period 42 in the mirror sections 12 and 18.

For the simple ridge, Block 50 represents the second growth that completes the vertical structure growth of the p-InP cladding layer 34 and the p+ contact layer 36 beneath the contacts 38.

Block 52 represents the proton implants 40 being performed to isolate sections of the laser 10, and to provide isolation between the modulator 20 and the laser 10.

Block 54 patterns the contacts 38, removes the p+ contact layer 36 therebetween by etching, and metalizes the contacts 38.

Block 56 etches a ridge waveguide 22 stripe down to the active region 32 or the waveguide layer 26.

Block 58 cleaves the laser 10 and modulator 20 device out of the wafer, and then applies antireflective (AR) coatings 28 on each end of the device.

Referring to FIG. 6B, Block 60 represents a first growth step, with an n-InP buffer layer 24, Q-waveguide layer 26, stop etch layer 30, active MQW region 32, and thin p-InP cladding layer 34 being grown.

Block 62 represents the patterning and selectively etching off of the thin top p-InP cladding layer 34 and active regions 32 down to the stop-etch layer 30, everywhere except in the gain section 16 of the laser 10.

Block 64 represents the patterning and etching of one or more sets of periodically sampled gratings of period 42 in the mirror sections 12 and 18 that are coupled to the active region 32.

For the buried ridge, Block 66 represents the second growth step, which comprises only a thin additional growth of the p-InP cladding layer 34 to cover the periodically sampled 42 gratings in the mirror sections 12 and 18.

Block 68 represents a patterning and etching of the buried ridge waveguide 22 stripe, which is etched laterally to beneath the waveguide layer 26.

Block 70 represents a third growth of the p-InP cladding layer 34 and the p+ contact layer 36.

Block 72 represents proton implants 40 being performed to isolate sections of the laser 10, and between the modulator 20 and the laser, as well as to limit lateral current leakage.

Block 74 patterns the contacts 38, removes the p+ contact layer 36 therebetween by etching, and metalizes the contacts 38.

Block 76 cleaves the laser 10 and modulator 20 device out of the wafer, and then applies antireflective (AR) coatings 28 on each end of the device.

CONCLUSION

This concludes the description of the preferred embodiment of the invention.

In summary, the present invention discloses a device, method, and article of manufacture related to a tunable laser source with integrated optical modulator. The tunable laser source is a widely tunable semiconductor laser that is comprised of an active region on top of a thick, low bandgap, waveguide layer, wherein both the waveguide layer and the active region are fabricated between a p-doped region and an n-doped region. An electro-absorption modulator is integrated into the semiconductor laser, wherein the electro-absorption modulator shares the waveguide layer with the semiconductor laser.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A tunable laser source comprising
   a widely tunable semiconductor laser comprised of an active region including multiple quantum wells (MQWs) grown on top of a thick, low bandgap, single common waveguide layer, wherein both the waveguide layer and the active region are fabricated between a p-doped region and an n-doped region; and
   an electro-absorption modulator integrated into the semiconductor laser, wherein the electro-absorption modulator does not include quantum wells (QWs) and instead uses Franz-Keldysh effects for modulation, the electro-absorption modulator shares the waveguide layer with the semiconductor laser, and the waveguide layer is designed to provide high index tuning efficiency in the laser and good reverse bias extinction in the modulator.

2. The tunable laser source of claim 1, wherein the semiconductor laser includes a sampled grating back mirror, a phase control section, a gain section, and a sampled grating front mirror.

3. The tunable laser source of claim 2, wherein the single common waveguide layer is used for the sampled grating back mirror, phase control section, gain section, sampled grating back mirror, and modulator.

4. The tunable laser source of claim 1, wherein the waveguide layer is a buried heterostructure waveguide, and the multiple quantum wells include offset multiple quantum wells that provide the laser's output.

5. The tunable laser source of claim 1, wherein the waveguide layer is a ridge waveguide, and the multiple quantum wells include offset multiple quantum wells that provide the laser's output.

6. The tunable laser source of claim 1, wherein the waveguide layer includes a blocking junction that blocks lateral current leakage in the laser and reduces parasitic junction capacitance of the modulator.

7. The tunable laser source of claim 1, wherein the semiconductor laser is rapidly tuned over a wide wavelength range by proper adjustment of control currents for the mirrors.

8. The tunable laser source of claim 1, wherein operation of the electro-absorption modulator is based on Franz-Keldysh effects in a bulk semiconductor waveguide.

* * * * *

UNITED STATES PATENT AND TRADEMARK OFFICE
CERTIFICATE OF CORRECTION

| | |
|---|---|
| PATENT NO. | : 7,342,950 B1 |
| APPLICATION NO. | : 10/049362 |
| DATED | : March 11, 2008 |
| INVENTOR(S) | : Mason et al. |

It is certified that error appears in the above-identified patent and that said Letters Patent is hereby corrected as shown below:

Column 7:

Claim 3, line 8, please delete "back" and insert --front--.

Signed and Sealed this

Twelfth Day of October, 2010

David J. Kappos
*Director of the United States Patent and Trademark Office*